United States Patent
Ebert et al.

(10) Patent No.: US 9,917,385 B2
(45) Date of Patent: Mar. 13, 2018

(54) COMPOSITE WINDOW PANE FOR A MOTOR VEHICLE AND PRODUCTION METHOD THEREFOR

(71) Applicant: GM GLOBAL TECHNOLOGY OPERATIONS LLC, Detroit, MI (US)

(72) Inventors: Frank Ebert, Ruesselsheim (DE); Bernd Bersch, Ruesselsheim (DE)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 15/448,346

(22) Filed: Mar. 2, 2017

(65) Prior Publication Data

US 2017/0256872 A1 Sep. 7, 2017

(30) Foreign Application Priority Data

Mar. 3, 2016 (DE) .................. 10 2016 002 636

(51) Int. Cl.
| | |
|---|---|
| H01Q 1/32 | (2006.01) |
| H01R 12/70 | (2011.01) |
| B60R 16/02 | (2006.01) |
| H01R 4/02 | (2006.01) |
| H01R 43/02 | (2006.01) |
| H05K 7/14 | (2006.01) |
| B60J 1/02 | (2006.01) |

(52) U.S. Cl.
CPC ......... *H01R 12/7076* (2013.01); *B60R 16/02* (2013.01); *H01R 4/02* (2013.01); *H01R 43/0256* (2013.01); *H05K 7/1417* (2013.01); *B60J 1/02* (2013.01)

(58) Field of Classification Search
CPC .. H01R 12/7076; H01R 4/02; H01R 43/0256; B60J 1/02; B60R 16/02; H05K 7/1417
USPC ........................................................ 343/713
See application file for complete search history.

(56) References Cited

U.S. PATENT DOCUMENTS

| | | | | |
|---|---|---|---|---|
| 5,548,372 | A | * 8/1996 | Schroeder | ................. G03F 9/00 355/53 |
| 5,760,744 | A | * 6/1998 | Sauer | ................ B32B 17/10036 29/600 |
| 2006/0250711 | A1 | * 11/2006 | Noguchi | ........... B32B 17/10036 359/883 |
| 2009/0144928 | A1 | 6/2009 | Yoo | |
| 2009/0174300 | A1 | 6/2009 | Jousse et al. | |
| 2015/0151611 | A1 | * 6/2015 | Gansen | ............. B32B 17/10036 428/138 |

FOREIGN PATENT DOCUMENTS

| | | |
|---|---|---|
| DE | 2328168 A | 12/1974 |
| DE | 69402440 T2 | 10/1997 |

(Continued)

OTHER PUBLICATIONS

German Patent Office, German Search Report for German Patent Application No. 10 2016 002 636.7 dated Dec. 21, 2016.

*Primary Examiner* — Sherman Ng
(74) *Attorney, Agent, or Firm* — Lorenz & Kopf LLP

(57) ABSTRACT

A method for producing a composite window pane, particularly a motor vehicle windscreen, includes mounting guide pins and electronic components on traces of a printed circuit board and inserting the printed circuit board between a first and a second glass plate. The guide pins are inserted in passthroughs in the first glass plate.

12 Claims, 3 Drawing Sheets

(56) References Cited

FOREIGN PATENT DOCUMENTS

| DE | 19829151 C1 | 2/2000 |
|----|----|----|
| DE | 10046489 C1 | 12/2001 |
| DE | 102013003686 A1 | 9/2014 |
| DE | 202009018915 U1 | 9/2014 |

* cited by examiner

COMPOSITE WINDOW PANE FOR A MOTOR VEHICLE AND PRODUCTION METHOD THEREFOR

CROSS-REFERENCE TO RELATED APPLICATION

This application claims priority to German Patent Application No. 10 2016 002 636.7, filed Mar. 3, 2016, which is incorporated herein by reference in its entirety.

TECHNICAL FIELD

The present disclosure pertains to a composite window pane, particularly a window pane for a motor vehicle with an integrated electronic circuit, and a method for producing such a composite window pane.

BACKGROUND

A composite window pane with integrated electronic circuit is described in the previously unpublished German patent application DE 10 2015 013 469.8. In the production of this window pane, a printed circuit board with mounted circuit components is connected between two glass plates of the composite window pane and contacted via wires that extend through passthroughs in one of the glass plates. The wires may be inserted in the passthroughs before the glass plates and the printed circuit board are joined together, or they may be inserted in the passthroughs after the plates and the circuit board have been assembled.

Errors that occur while the printed circuit board is being placed can make it impossible for the contacting to take place, but they are difficult to correct because they only become apparent after the printed circuit board is placed in position, and in order to correct them the flexible printed circuit board would have to be lifted off the glass plate and then spread out over it again without any creases or bubbles.

SUMMARY

The present disclosure provides a method for producing a composite window pane, which makes it possible to avoid errors when placing the printed circuit board before they occur. According to one variant of the present disclosure, a method includes mounting guide pins and electronic components on a printed circuit board, and inserting the printed circuit board between a first and a second glass plate. The guide pins are inserted in passthroughs in the first glass plate.

Since the guide pins are already in position on the printed circuit board when the printed circuit board and the first glass plate are joined together, they prevent the two from coming into contact, unless they engage in the passthroughs of the first glass plate. This makes it impossible for the printed circuit board to be placed in a position in which it cannot be contacted.

If the guide pins themselves are metallic, the traces may be contacted via the guide pins themselves. However, it is also conceivable to use guide pins that are not electrically conductive, but which simply ensure the contact pin which is inserted in the passthrough after the composite window pane has been put together by engaging in a passthrough that conductive will come into contact with the trace that is marked by the guide pin.

Metallic guide pins can be assembled on the printed circuit board together with the electronic components of the circuit in the same soldering step.

However, another variant is conceivable in which, in a soldering step for mounting the electronic components on the printed circuit board, initially only creating soldering pads for the guide pins on the printed circuit board, and then soldering the guide pins as they are placed on the soldering pads while hot. This particularly makes it possible to mount guide pins which are difficult to assemble in a wave soldering operation because of their dimensions.

In step b), the printed circuit board should first be positioned on the first glass plate and then covered with the second glass plate. If the printed circuit board were to be positioned on the second glass plate first, any inaccuracy occurring in this step would make it impossible for the glass plates to be positioned congruently against one another.

The guide pins should be introduced into the passthroughs even before the printed circuit board comes into contact with the first glass plate itself for the first time. This ensures that the printed circuit board is orientated correctly even before the first contact. After emerging from the passthroughs, the printed circuit board may then be spread out over the first glass plate without creases or bubbles.

A layer of composite plastic which is essential for keeping the composite window pane together even after a notional breakage of the glass plate should be inserted between the printed circuit board and the second glass plate. This ensures that it does not obstruct the positioning of the printed circuit board on the first glass plate and in particular does not prevent the guide pins from protruding into the passthroughs in the first glass plate.

The printed circuit board is preferably covered by the plastic composite layer when the glass plates are joined with each other. The placement of the plastic composite layer is made considerably easier if a window has not been cut out of it to accommodate the printed circuit board, and which would require attention to ensure the correct positioning thereof. Furthermore, the printed circuit board is protected effectively from ambient moisture by the plastic composite layer, particularly if the circuit board does not extend as far as the edge of the composite window pane and instead is stuck to the first glass plate by the plastic composite layer extending around the border of the printed circuit board.

In order to stabilize the guide pins after the glass plates have been joined, in a further method step c) the cavities that remain after the guide pins have been inserted in the passthroughs may be filled in. The filling material may be solder, which is able to penetrate the cavities spontaneously due to capillary forces.

The present disclosure also provides a method to create a composite glass window pane that can be produced simply and reliably.

According to one variant of the present disclosure, a composite window pane, particularly a window pane for a motor vehicle, includes two glass plates and a printed circuit board with electronic components and guide pins mounted thereon and embedded between the glass plates, in which the guide pins have a flat frontal face which bears on the printed circuit board and are secured on the printed circuit board by solder.

The frontal face should be large enough to anchor to the guide pin firmly on the printed circuit board and particularly to prevent the guide pin from becoming misaligned when it is inserted in the associated passthrough. Therefore, the contact pins should have head facing toward the frontal face, on which said frontal face is located, and a shaft which faces away from the printed circuit board and which is thinner than the head.

To ensure that a guide pin is not pulled out of its passthrough subsequently or to guarantee that the solder contact with the printed circuit board cannot be damaged by a force acting on the shaft of the guide pin, the cross section of the head of a contact pin may be larger than the cross section of the passthrough that accommodates the shaft of the contact pin.

BRIEF DESCRIPTION OF THE DRAWINGS

The present disclosure will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any theory presented in the preceding background of the invention or the following detailed description.

Figure 1:
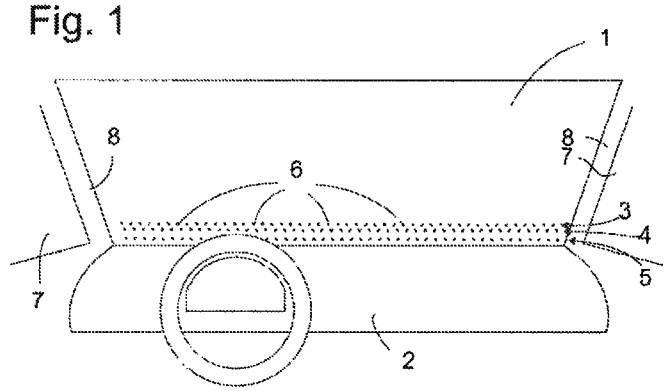
FIG. 1 is a schematic view of a composite window pane according to the present disclosure, fitted in a motor vehicle.

FIG. 1 shows a schematic view of a front windscreen 1 in the form of a composite window pane according to the present disclosure and below it the dashboard 2 of a motor vehicle from the viewpoint of a driver. Rows 3, 4, 5 of LEDs 6 are embedded in front windscreen 1, as will be explained in greater detail. LEDs 6 are part of a parking assistant, which is described to the extent necessary for helping to understand the structure of composite window pane 1. The parking assistant includes an environmental sensor, for example a radar sensor that is capable of detecting the distance and dimensions of obstructions close to the motor vehicle, and of actuating the LEDs 6 depending on the result of such detection that the LEDs activated on this basis are positioned in front of the detected obstruction from the point of view of the driver, thereby indicating clearly the direction from which danger threatens, and to show the driver the distance from the obstruction depending on which of rows 3, 4, 5 the activated LEDs belong to, and/or the colour of the activated LEDs. This also enables the driver to reliably avoid obstacles that are not visible from his perspective when parking, for example because they are hidden by the car bonnet.

Of course, other windows of the motor vehicle as well as the front windscreen 1 may be designed in the form of composite window panes with embedded LEDs, for example, rows 3, 4, 5 of LEDs 6 in front windscreen 1 may also be extended into the adjacent side windows 7 on the right and left, and may possibly even include LEDs on A-pillars 8 between them, or a rear window of the motor vehicle may be equipped with LEDs that are able to warn the driver of any obstructions when the driver is reversing as well.

Figure 2:
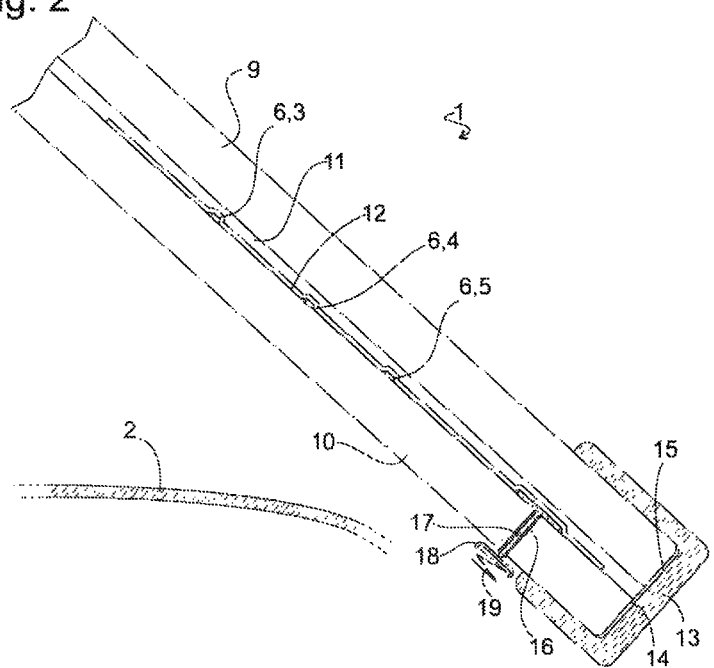
FIG. 2 is a cross section through the lower edge area of the composite window pane according to a first variation of the present disclosure.

FIG. 2 shows a schematic cross section through a lower edge area of front windscreen 1 according to one variant of the present disclosure. Front windscreen 1 includes two glass plates, an outer glass plate 9 facing outwards and an inner glass plate 10 facing towards the passenger compartment, and between them a composite layer 11 made from a durable plastic such as polyvinyl butyral (PVB) for example, to which the glass plates 9, 10 are attached by surface adhesion and which serves to hold the fragments together in the event that one of the glass plates 9, 10 shatters. A flexible printed circuit board 12—on which rows 3, 4, 5 of LEDs 6 extend transversely to the sectional plane—is embedded between composite layer 11 and inner glass plate 10 and extends over a part of the area thereof.

Printed circuit board 12 does not extend far enough to come into direct contact with a lower edge 14 of front windscreen 1, which is framed by a flexible seal 13. Consequently, printed circuit board 12 is protected from any precipitation that might penetrate a gap 15 between lower edge 14 and seal 13 by composite layer 11 which extends as far as edge 14 and completely fills in the cavity there between the glass plates 9, 10.

Printed circuit board 12 is furnished with a plurality of guide pins 17, which engage in passthroughs 16 in inner glass plate 10. Guide pins 17 are made of metal and are each connected in electrically conductive manner to a trace on printed circuit board 12. One of these guide pins 17 is shown in cross section in FIG. 2. In order to ensure contact with it, a metal plate 18 is biased by a spring 19 towards the tip of guide pin 17 that protrudes from the composite window pane into the interior of the motor vehicle.

Figure 3A:
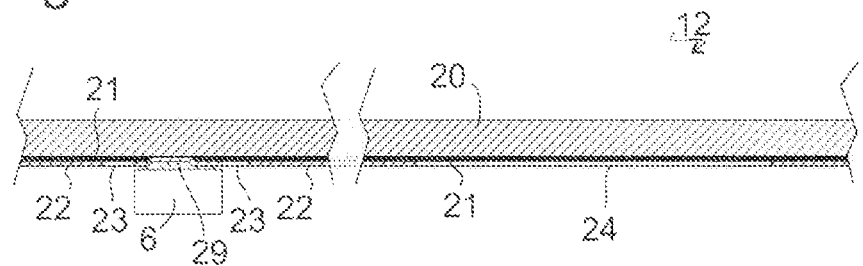
FIGS. 3a-c shows a method for producing the composite window pane.

FIG. 3a shows a schematic cross section through printed circuit board 12. Printed circuit board 12 has a flexible substrate 20, on a polyimide base for example, on which traces 21 are mounted, in one plane as shown in the figure, or in several planes if required. An insulating foil 22 covers traces 21. Foil 22 is furnished with apertures at sites 23 where a light emitting diode 6 is to be connected to traces 21—at the stage shown in FIG. 3a this is only attached adhesively—and at sites 24 where a solder pad is to be created.

Figure 3B:
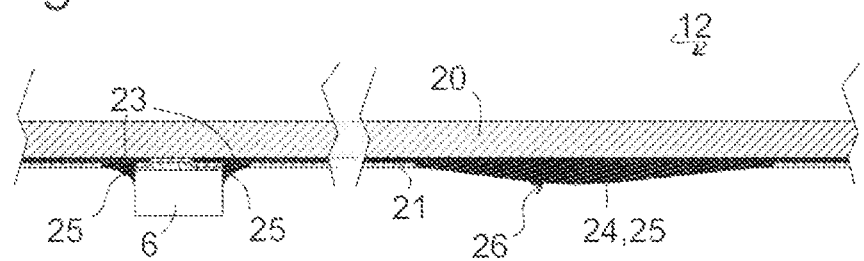
Figure 3C:
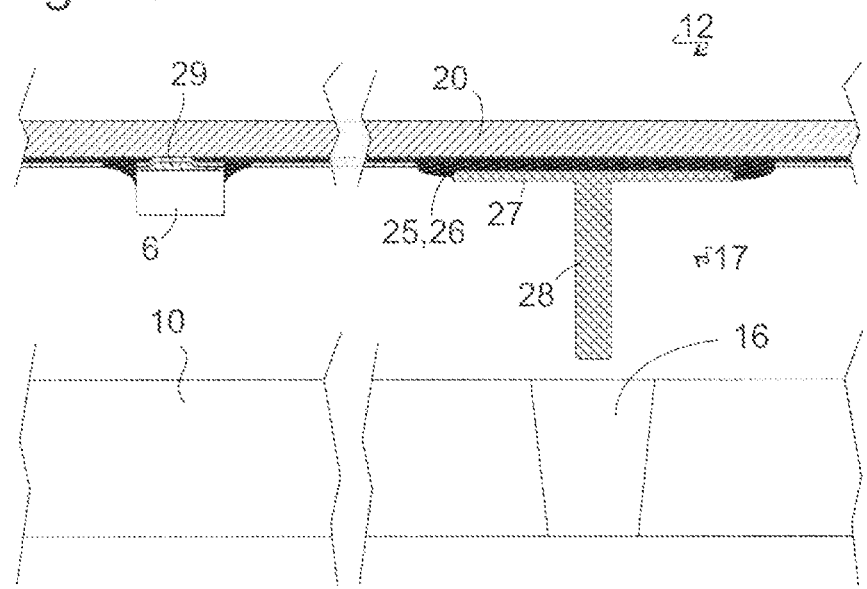

FIG. 3b shows printed circuit board 12 after it has passed through a solder bath. Solder 25 sticks to the sites 23 and 24 of traces 21 that are not covered by foil 22. At sites 23 it contacts light emitting diode 6, at site 24 it forms a solder pad 26 on which in the next step a guide pin 17 is mounted, as shown in FIG. 3c.

In this example guide pin 17 is shaped like a drawing pin, with a flat head 27 and a shaft 28. It is mounted by pressing against solder pad 26 while it is still hot, and so melts solder 25. Alternatively, like light emitting diode 6, guide pin 27 may be placed on substrate 20 and fixed temporarily with adhesive 29 before it passes through the solder bath, to be attached permanently afterwards with solder that penetrates between trace 21 and head 27.

The finished printed circuit board 12 is then placed on the inner glass plate 10 in such a way that the tips of guide pins 17 are positioned opposite the passthroughs 16 in the inner glass plate 10. In order to make it easier to align guide pins 17 with passthroughs 16, passthroughs 16 may be flared conically, as shown in FIG. 3c.

Since the surface of inner glass plate 10, on which printed circuit board 12 is to be mounted has a convex curvature, it is a simple matter to introduce the tips of guide pins 17 into passthroughs 16 before the printed circuit board 12 and the glass plate 10 come into contact with each other elsewhere.

Figure 4A:
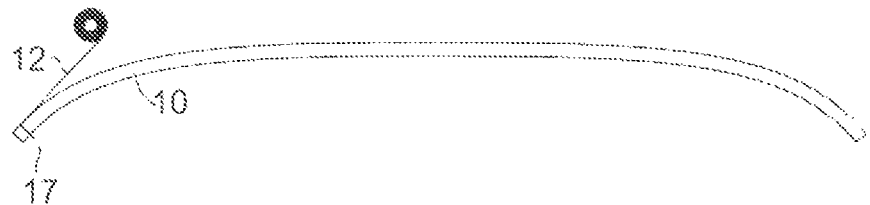
FIGS. 4a-d show further the method.

As soon as the first contact is made between the flexible printed circuit board 12 and glass plate 10, printed circuit board 12 tends to cling closely to glass plate 10 and to stick to it adhesively. In order to prevent creases from forming when approaching with printed circuit board 12, the first contact between printed circuit board 12 and glass plate 10 is made in the immediate vicinity of guide pins 17, as shown in FIG. 4a.

Here, printed circuit board 12 is in the form of a strip due to the arrangement of light emitting diodes 6 in elongated rows 3, 4, 5, and guide pins 17 are arranged at one end of the strip. Therefore, printed circuit board 12 is brought into contact with glass plate 10 progressively starting from this end, as it unrolls, for example.

Figure 4B:
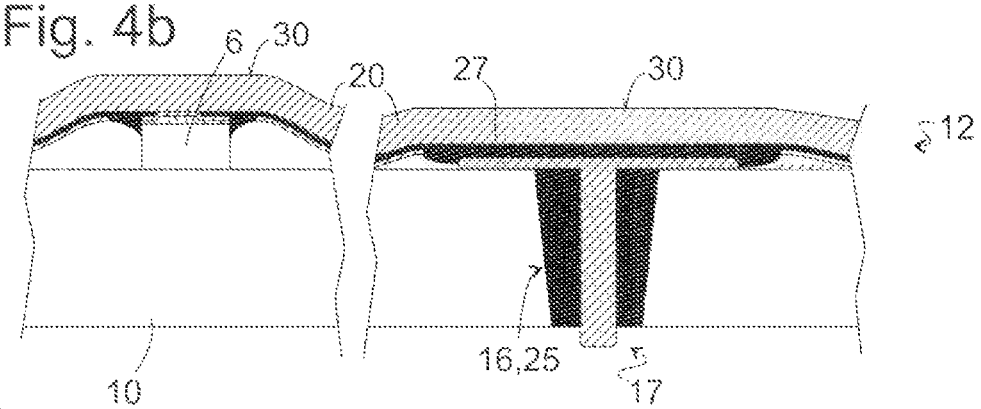

In this context, the light emitting surfaces of light emitting diodes 6 come to bear on the outer side of glass plate 10 as shown in FIG. 4b. Head 27 of guide pin 17 comes into contact with the outside of glass plate 10 all around passthrough 16.

In order to stabilize guide pin 17 in passthrough 16, passthrough 16 may be filled in, with solder 25 for example, after guide pin 17 has been inserted.

Figure 4C:
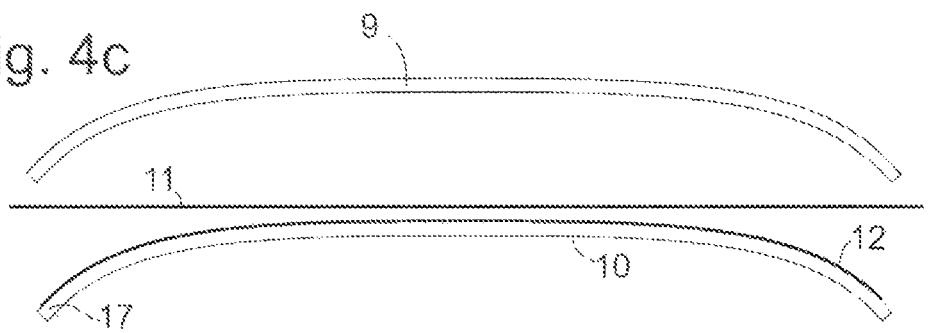
Figure 4D:
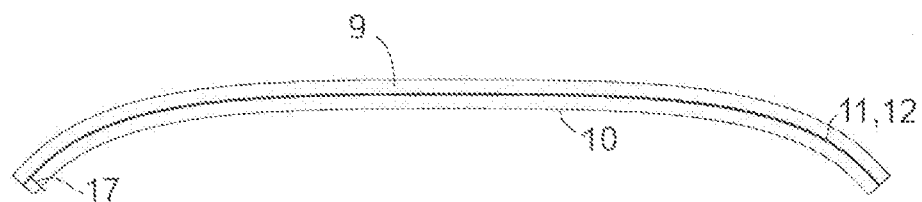

As shown in FIG. 4c, the composite window pane is produced by spreading composite layer 11 between glass plate 9 on one side and glass plate 10 and printed circuit board 12 on the other side, and then bringing the two glass plates 9, 10 together, wherein composite layer 11 clings to glass plates 9, 10 and printed circuit board 12. The composite obtained in this way (see FIG. 4d) is first placed under vacuum to remove any residual air in the cavity between the glass plates 9, 10, and finally heated under pressure to partially melt composite layer 11 and cause it to adhere to the glass plates 9, 10 and printed circuit board 12.

The prominences 30 on the exposed surface of substrate 20 (see FIG. 4b) caused by the inclusion of the light emitting diodes 6 and guide pins 17 are not as high as the thickness of composite layer 11. As composite layer 11 yields locally to the pressure of these prominences 30 during the partial melting, a full-surface contact is achieved between printed circuit board 12 and composite layer 11.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment, it being understood that various changes may be made in the function and arrangement of elements described in an exemplary embodiment without departing from the scope of the invention as set forth in the appended claims and their legal equivalents.

What is claimed is:

1. A method for producing a composite window pane comprising: a) mounting guide pins and electronic components on traces of a printed circuit board; b) inserting the printed circuit board between a first glass plate and a second glass plate, wherein the guide pins are inserted in passthroughs in the first glass plate; and c) interposing a plastic composite layer between the printed circuit board and the second glass plate.

2. The method according to claim 1, wherein the guide pins are metallic.

3. The method according to claim 2, further comprising mounting the guide pins and the electronic components in a common soldering process.

4. The method according to claim 2, further comprising positioning the guide pins on a solder pad on the printed circuit board while hot.

5. The method according to claim 1, further comprising positioning the printed circuit board on the first glass plate and then covering the printed circuit board with the second glass plate.

6. The method according to claim 5, further comprising inserting the guide pins in the passthroughs before a contact is created between the printed circuit board and the first glass plate, and spreading the printed circuit board over the first glass plate starting from the passthroughs.

7. The method according to claim 1, further comprising covering the printed circuit board by the plastic composite layer.

8. The method according to claim 1, further comprising filling cavities that remain after the guide pins have been inserted in the passthroughs.

9. The method according to claim 8, further comprising filling the cavities with solder.

10. A composite window pane comprising: first and second glass plates, wherein the first glass plate has passthroughs formed therein; a plastic composite layer interposed between the printed circuit board and the second glass plate: and a printed circuit board having electronic components and guide pins having a flat frontal face bearing on the printed circuit board and secured on the printed circuit board by solder; wherein the printed circuit board is embedded between the first and second glass plates such that that guide pins are inserted into the passthroughs.

11. The composite window pane according to claim 10, wherein the guide pins comprise a head facing towards the printed circuit board, on which the frontal face is located, and a shaft facing away from the printed circuit board, which is thinner than the head.

12. The composite window pane according to claim 11, wherein a cross section of the head of the guide pin is larger than a cross section of the passthrough that accommodates the shaft of the guide pin.

* * * * *